(12) United States Patent
Hosoda et al.

(10) Patent No.: US 11,218,117 B2
(45) Date of Patent: Jan. 4, 2022

(54) AMPLIFIER CIRCUIT AND ANTENNA DEVICE

(71) Applicant: FUJITSU LIMITED, Kawasaki (JP)

(72) Inventors: Masayuki Hosoda, Yamato (JP); Yoichi Kawano, Setagaya (JP); Alexander Nikolaevich Lozhkin, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 141 days.

(21) Appl. No.: 16/659,668

(22) Filed: Oct. 22, 2019

(65) Prior Publication Data

US 2020/0136568 A1 Apr. 30, 2020

(30) Foreign Application Priority Data

Oct. 29, 2018 (JP) .............................. JP2018-203176

(51) Int. Cl.
*H03F 1/32* (2006.01)
*H04B 1/04* (2006.01)
(Continued)

(52) U.S. Cl.
CPC .............. *H03F 1/3247* (2013.01); *G01S 7/03* (2013.01); *G01S 7/40* (2013.01); *H01Q 3/28* (2013.01); *H01Q 21/06* (2013.01); *H03F 1/3205* (2013.01); *H04B 1/0458* (2013.01); *H04B 2001/045* (2013.01)

(58) Field of Classification Search
CPC ...... H04B 1/04; H04B 1/0458; H04B 1/0475; H04B 1/0483; H04B 1/40; H04B 2001/0425; H04B 2001/0408; H04B 2001/0433; H04B 15/00; H03F 1/32; H03F 1/3205; H03F 1/3241; H03F 1/3247; H03F 1/3252; H03F 3/21; H03F 3/24; H03F 3/087; H03F 3/189; H03F 3/195; H03F 3/211; H03F 3/213; H03F 3/505; H03F 3/602; H03F 2200/18; H03F 2200/78; H03F 2200/105; H03F 2200/129; H03F 2200/321; H03F 2200/372; H03F 2200/411; H03F 2200/451; H03F 2201/3227;
(Continued)

(56) References Cited

U.S. PATENT DOCUMENTS 5,798,665 A 8/1998 Ichihara
7,443,245 B2 * 10/2008 Tsurumaki .............. H03F 1/301
330/134
(Continued)

FOREIGN PATENT DOCUMENTS

JP 9-121125 A 5/1997
JP 10-65456 A 3/1998
(Continued)

*Primary Examiner* — Quochien B Vuong
(74) *Attorney, Agent, or Firm* — Fujitsu Patent Center

(57) ABSTRACT

An amplifier circuit includes: a plurality of amplifiers; a plurality of monitor elements provided for each of the plurality of amplifiers and disposed on a same chip with the corresponding amplifier; and a processor configured to: measure characteristics of each of the plurality of monitor elements; reduce a difference in distortion between a plurality of signals output from the plurality of amplifiers based on the measured characteristics; and compensate for the distortion.

18 Claims, 7 Drawing Sheets

(51) Int. Cl.
*H01Q 21/06* (2006.01)
*H01Q 3/28* (2006.01)
*G01S 7/03* (2006.01)
*G01S 7/40* (2006.01)

(58) Field of Classification Search
CPC . H03F 2203/21106; H03F 2203/45361; G01S 7/03; G01S 7/40; H01Q 3/28; H01Q 21/06
See application file for complete search history.

(56) References Cited

U.S. PATENT DOCUMENTS

| | | | |
|---|---|---|---|
| 8,294,516 B2* | 10/2012 | Young | H03F 1/3247 |
| | | | 330/149 |
| 8,428,525 B2* | 4/2013 | Bai | H03F 3/24 |
| | | | 455/114.3 |
| 9,853,599 B2* | 12/2017 | Bonebright | H04B 1/0475 |
| 9,923,524 B2* | 3/2018 | Carbone | H04B 1/0483 |
| 9,923,582 B2* | 3/2018 | Lee | H04B 1/04 |
| 10,218,318 B2* | 2/2019 | Schemmann | H04B 1/0475 |
| 2018/0053997 A1 | 2/2018 | Noto et al. | |

FOREIGN PATENT DOCUMENTS

| | | |
|---|---|---|
| JP | 2005-227031 A | 8/2005 |
| WO | 2016/167145 A1 | 10/2016 |

\* cited by examiner

AMPLIFIER CIRCUIT AND ANTENNA DEVICE

CROSS-REFERENCE TO RELATED APPLICATION

This application is based upon and claims the benefit of priority of the prior Japanese Patent Application No. 2018-203176, filed on Oct. 29, 2018, the entire contents of which are incorporated herein by reference.

FIELD

The present embodiment relates to an amplifier circuit and an antenna device.

BACKGROUND

In an antenna device, a distortion compensation unit compensates for distortion caused by a plurality of power amplifiers.

Related art is disclosed in International Publication Pamphlet No. WO 2016/167145).

SUMMARY

According to an aspect of the embodiments, an amplifier circuit includes: a plurality of amplifiers; a plurality of monitor elements provided for each of the plurality of amplifiers and disposed on a same chip with the corresponding amplifier; and a processor configured to: measure characteristics of each of the plurality of monitor elements; reduce a difference in distortion between a plurality of signals output from the plurality of amplifiers based on the measured characteristics; and compensate for the distortion.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

For example, an antenna device includes a distortion compensation unit configured to compensate for distortion caused by a plurality of power amplifiers, by multiplying a baseband signal by a predistortion signal that gives distortion characteristics opposite to the distortion characteristics of a signal emitted from an array antenna.

However, in the case where there is a variation in characteristics of each of a plurality of amplifiers, distortion of a signal output from each of the plurality of amplifiers may remain even when distortion compensation is performed.

Therefore, an amplifier circuit and an antenna device able to suppress distortion of a signal output from each of a plurality of amplifiers may be provided.

Hereinafter, an embodiment of the present disclosure will be described with reference to the drawings.

Figure 1:
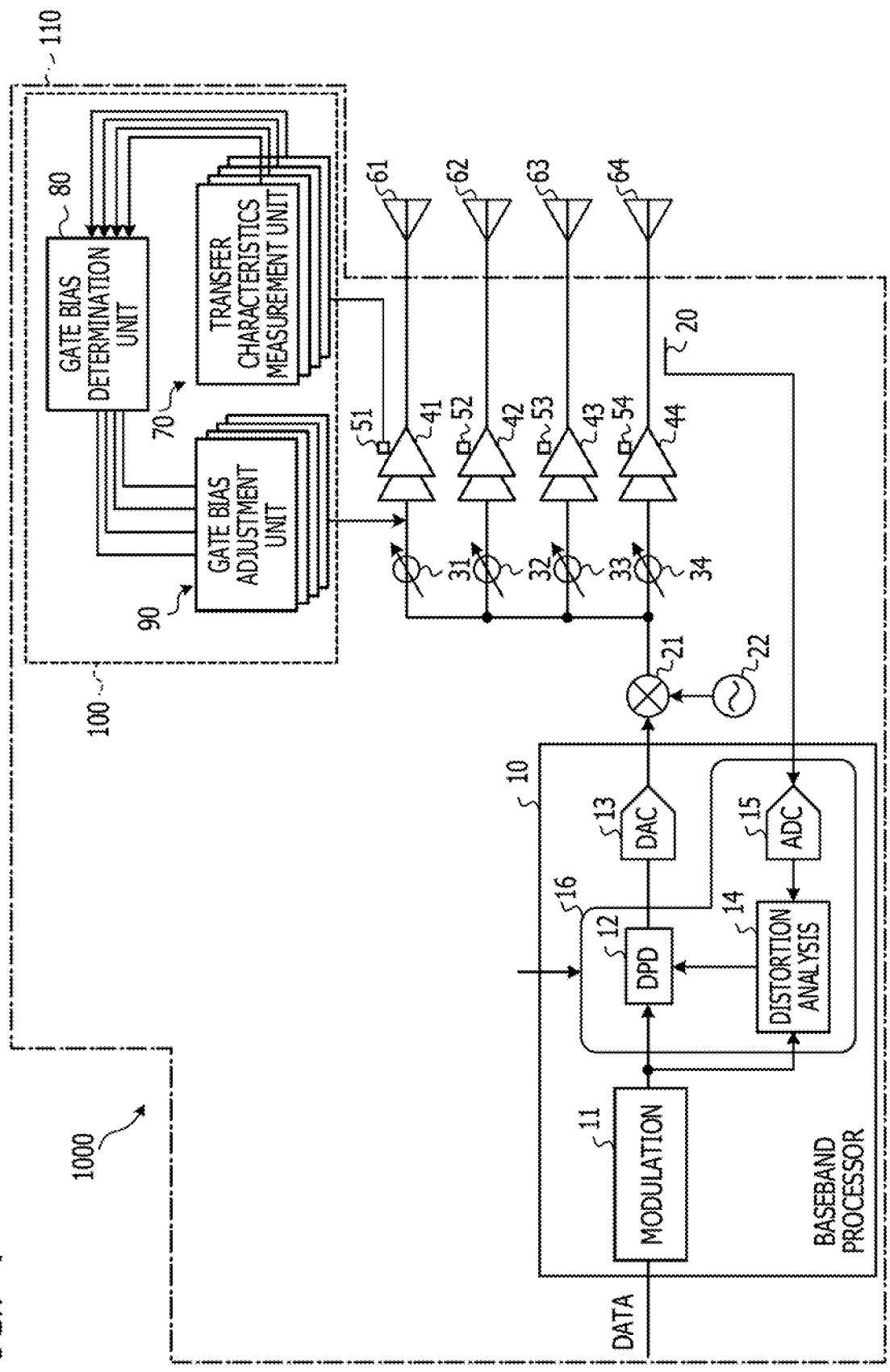
FIG. 1 is a diagram illustrating a configuration example of an antenna device.

FIG. 1 is a diagram illustrating a configuration example of an antenna device according to an embodiment of the present disclosure. An antenna device 1000 illustrated in FIG. 1 uses an array antenna technique, a multi-level modulation technique, and a distortion compensation technique of a power amplifier in order to achieve wireless transmission of high data capacity and long distance.

The array antenna technique is a technique in which output power from a power amplifier (PA) is discharged from a plurality of antennas arranged in array form, so that the directivity of radio waves is improved by making use of interference between the radio waves output from the plurality of antennas. By utilizing the array antenna technique, communication over a longer distance may be carried out with the same power.

Furthermore, by coupling a plurality of power amplifiers to each of the plurality of antennas, it is possible to discharge, to a space, amounts of power that a single power amplifier is unable to handle. As a result, it is possible to configure a transmitter of high directivity and large output, so that communication of a longer distance may be carried out.

The multi-level modulation technique is a technique for communicating with a higher data capacity within a given frequency band, by combining amplitude modulations, phase modulations, or both the amplitude and phase modulations. Since the amplitude or phase of the radio waves to be transmitted is divided into multiple stages and a large number of codes are allocated to them to carry out the communication, correct code transmission may not be made in some cases due to an error in the amplitude or phase. With the progress of the multi-level modulation, an allowable error may be required to be small in order to achieve error-free communication.

The PA is an amplifier for generating a radio wave of high power to be output from the antenna, and an output waveform of the PA includes distortion. In consideration of using a PA of the same rating, the output is small when used in a range where the distortion is small, but when it is attempted to obtain a large output, the distortion is likely to become large. When the distortion becomes large, an error rate (bit error rate (BER)) of the transmission codes in the modulation is increased, and an adjacent channel leakage power ratio (ACPR) is also increased, thereby causing deterioration in communication quality. In particular, allowable leakage power to adjacent channels is regulated by law.

Therefore, a distortion compensation technique is applied to a PA for achieving wireless transmission over a long distance.

As a specific example of a distortion compensation technique applied to an antenna device using the array antenna technique, there exist a technique configured to perform distortion compensation based on an output composite waveform to the array antenna, and a technique configured to perform distortion compensation on each individual PA.

The former technique is able to appropriately reduce distortion with respect to a composite output that is output in the main beam direction from the array antenna. However, when there is a variation in characteristics of each PA, distortion is not reduced with respect to a composite output in a direction of a sideband (also referred to as a side lobe), and there is a risk that the distortion is increased depending on conditions.

The latter technique is easy to achieve an adequate distortion reduction regardless of beam directions. However, since distortion compensation blocks of the same number as that of the PAs are provided, there is a concern that the circuit size, power consumption and the like may increase, or that the power utilization efficiency of the whole system may be significantly lowered. In particular, in the communication of high data capacity, a digital predistortion technique may be used, in which a high-speed analog-to-digital converter (ADC) and a high-speed arithmetic processing unit are required for detecting and analyzing signal waveforms. Since the power consumption of these units is relatively large, the power consumption of the whole antenna device is also largely increased.

Therefore, the technique of the present disclosure provides, in order to suppress power consumption caused by the distortion compensation units, an amplifier circuit including a small number of distortion compensation units as compared with PAs, and an antenna device, and also provides a scheme for effectively suppressing distortion caused by a plurality of PAs by using the small number of distortion compensation units.

Specifically, an antenna device 1000 including an amplifier circuit 110 as illustrated in FIG. 1 is provided. The antenna device 1000 includes a plurality of antennas (four antennas 61 to 64 in the drawing), and the amplifier circuit 110 configured to supply power to the plurality of antennas. The amplifier circuit 110 includes a plurality of PAs (four PAs 41 to 44 in the drawing), and a single distortion compensation unit 16 common to the plurality of PAs.

In the case where the single distortion compensation unit common to the plurality of PAs performs compensation processing collectively on the distortions caused by the respective PAs, when there is a variation in characteristics of each of the plurality of PAs, there is a risk that the compensation processing on the distortions of the signals output from each of the plurality of amplifiers may not be sufficiently performed so that some of the distortions may remain. However, in the case where the characteristics of each of the plurality of PAs are substantially equal to each other, the distortions of the signals output from each of the plurality of amplifiers may be sufficiently suppressed even when the single distortion compensation unit 16 common to the plurality of PAs performs the distortion compensation processing.

Next, the antenna device 1000 having a configuration for making the characteristics of the plurality of PAs equal to each other will be described in more detail.

The antenna device 1000 includes the amplifier circuit 110 and the plurality of antennas 61 to 64. The antenna device 1000 transmits radio waves from the plurality of antennas 61 to 64 based on high frequency signals amplified by the amplifier circuit 110. The antenna device 1000 is, for example, a phased array antenna device configured to transmit and/or receive radio waves by a time division duplex (TDD) scheme or a frequency division duplex (FDD) scheme. However, the communication schemes are not limited thereto. Specific examples of the antenna device 1000 include a radio base station, a mobile phone, a smartphone, an Internet of Things (IoT) device and the like. However, the specific examples thereof are not limited thereto.

The antennas 61 to 64 are elements configured to be supplied with transmission signals (high frequency signals) having been amplified by the amplifier circuit 110, respectively, and transmit radio waves corresponding to the respective transmission. Each of the antennas 61 to 64 is supplied with a transmission signal having been amplified by the corresponding PA among the plurality of PAs 41 to 44 provided in the output stage of the amplifier circuit 110.

Although FIG. 1 illustrates an example in which the number of antennas and the number of PAs are respectively four, the technique of the present disclosure is also applicable to cases of other numbers, for example, applicable when the number is equal to or more than two. Moreover, a plurality of, for example, eight PAs may be coupled to a single antenna.

The amplifier circuit 110 includes a baseband processor 10, an up-converter 21, an oscillator 22, a coupler 20, a plurality of phase shifters 31 to 34, the plurality of PAs 41 to 44, a plurality of monitor elements 51 to 54, and an adjustment section 100.

The baseband processor 10 generates a baseband signal having experienced distortion compensation processing. The baseband processor 10 includes a modulator 11, the distortion compensation unit 16, and a digital-to-analog converter (DAC) 13. The distortion compensation unit 16 includes a digital predistortion (DPD) unit 12, a distortion analysis unit 14, and an analog-to-digital converter (ADC) 15.

The modulator 11 performs, for example, quadrature modulation on transmission data (digital signal) to be transmitted by the antenna device 1000, and outputs a baseband signal, which is a digital signal after quadrature modulation, to the distortion compensation unit 16. The baseband signal is supplied to the digital predistortion (DPD) unit 12 and the distortion analysis unit 14.

The DPD unit 12 performs distortion compensation processing to compensate for the distortion of the baseband signal supplied from the modulator 11 by using a predistortion signal supplied from the distortion analysis unit 14. The predistortion signal is a distortion compensation signal.

The DAC 13 converts the baseband signal having experienced the distortion compensation processing (the baseband signal after the distortion compensation processing) by the DPD unit 12 of the distortion compensation unit 16 from digital to analog, and then outputs the analog baseband signal to the up-converter 21.

The up-converter 21 multiplies the baseband signal supplied from the DAC 13 by a local signal generated by the oscillator 22 to up-convert the analog baseband signal to a high frequency band signal. The up-converter 21 outputs the up-converted high frequency signal (transmission signal). The transmission signal output from the up-converter 21 is distributed to the plurality of phase shifters 31 to 34 by a distributor (not illustrated).

Each of the phase shifters 31 to 34 adjusts the phase of the high frequency signal, which has been distributed and is to be inputted, in accordance with the directivity of each of the antennas 61 to 64. Each of the phase shifters 31 to 34 outputs the high frequency signal after phase adjustment to the corresponding PA among the plurality of PAs 41 to 44.

Each of the PAs 41 to 44 is an amplifier configured to amplify the power of the high frequency signal supplied from the corresponding phase shifter among the phase shifters 31 to 34. Each of the PAs 41 to 44 amplifies the high frequency signal inputted from the corresponding phase shifter, and outputs the amplified high frequency signal to the corresponding antenna among the plurality of antennas 61 to 64.

The coupler 20 outputs a feedback signal corresponding to the power of one signal (a signal output from the PA 44 in the drawing) among the signals output from each of the PAs 41 to 44. Since the characteristics of the plurality of PAs are substantially equalized to each other by an adjustment operation to be described later performed by the adjustment section 100, it is sufficient that the feedback signal is taken out from one signal among the signals output from each of the PAs 41 to 44, not from all of the signals output from each of the PAs 41 to 44.

The ADC 15 converts the feedback signal supplied from the coupler 20 from analog to digital, and outputs the digital feedback signal to the distortion analysis unit 14.

The distortion analysis unit 14 generates a predistortion signal based on a difference between the baseband signal supplied from the modulator 11 and the feedback signal supplied from the ADC 15. For example, the distortion analysis unit 14 calculates a distortion compensation coefficient which gives, to the baseband signal from the modulator 11, distortion characteristics opposite to the distortion characteristics of the one signal (the signal output from the PA 44 in this case) among the signals output from each of the PAs 41 to 44, based on the above-mentioned difference. The distortion analysis unit 14 generates and outputs the predistortion signal indicating the calculated distortion compensation coefficient. The predistortion signal may be generated by a known look-up table (LUT) method or the like. However, the generation method thereof is not limited thereto.

The adjustment section 100 is a circuit block configured to measure gate bias dependence of a transistor element included in each of the plurality of PAs, and analyze conditions under which the difference in distortion characteristics between each of the PAs is reduced based on the above measurement results, in order to equalize the distortions of the signals output from each of the PAs. Based on the analysis result, the adjustment section 100 controls the gate bias applied to each PA. With this, since the difference in distortion characteristics between each of the PAs is reduced, it is possible for the single distortion compensation unit 16 common to the plurality of PAs to effectively reduce the sum total of distortion of the output signals of the plurality of PAs.

The adjustment section 100 includes a transfer characteristics measurement unit 70, a gate bias determination unit 80, and a gate bias adjustment unit 90. The respective functions of the transfer characteristics measurement unit 70, the gate bias determination unit 80, and the gate bias adjustment unit 90 are enabled by, for example, operating a central processing unit (CPU) by a program stored in a memory in a readable manner.

The transfer characteristics measurement unit 70 is an example of a characteristics measurement unit configured to measure characteristics of each of the plurality of monitor elements. The transfer characteristics measurement unit 70 acquires bias dependence characteristics of the current and the voltage of each terminal of the monitor element corresponding to a transistor in each PA, and calculates an element parameter representing the bias dependence characteristics for each monitor element corresponding to the transistor in each of the PAs. The gate bias determination unit 80 compares the characteristics acquired by the transfer characteristics measurement unit 70 with respect to each of the PAs, and determines a bias value to be applied to each PA. The gate bias adjustment unit 90 applies a bias to each PA based on the bias value determined by the gate bias determination unit 80.

Figure 2:
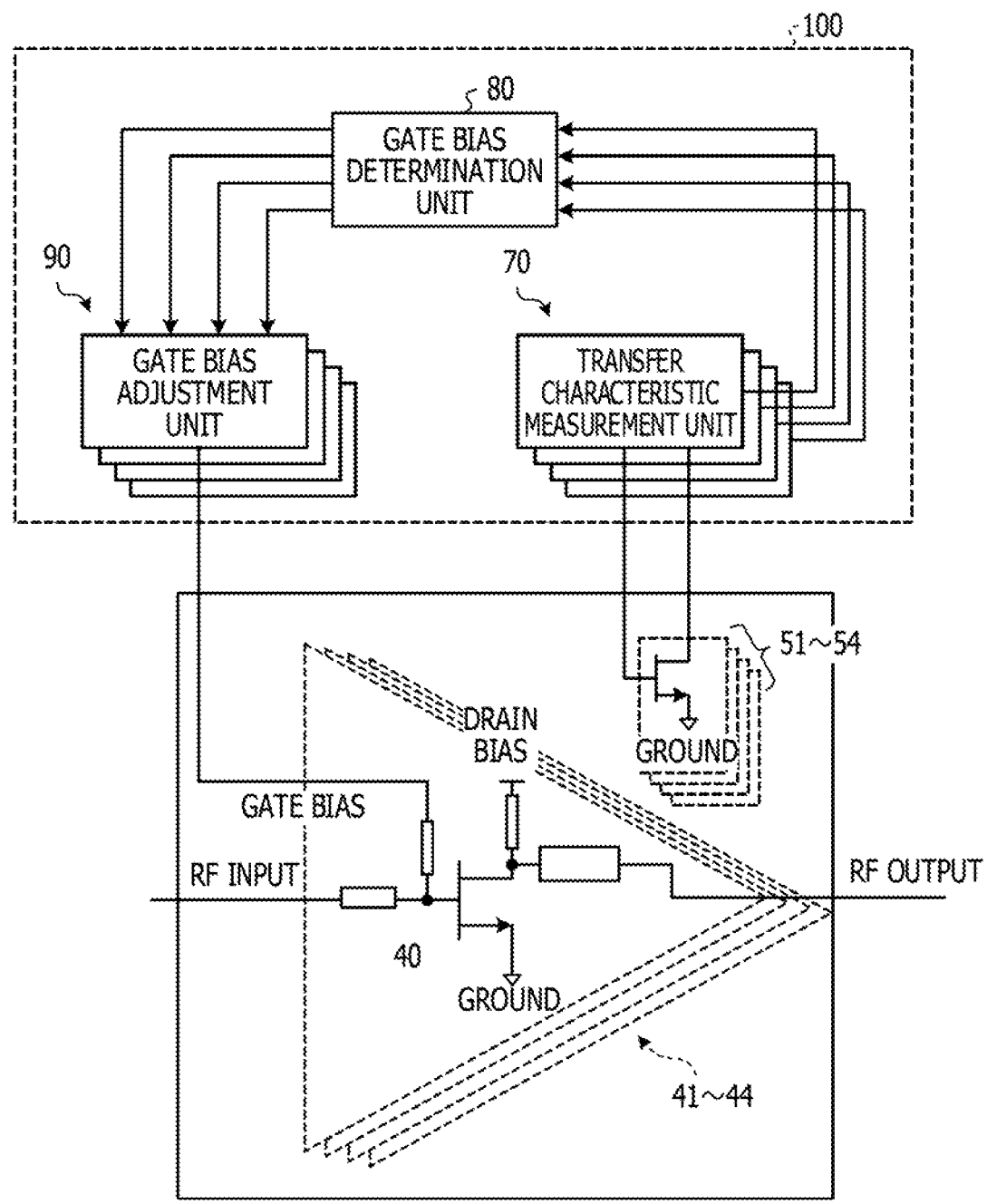
FIG. 2 is a diagram illustrating a configuration example of an amplifier.

FIG. 2 is a diagram illustrating a configuration example of an amplifier. FIG. 2 also illustrates a configuration of the adjustment section 100.

Each of the PAs 41 to 44 is a circuit including a transistor 40 for amplifying a high frequency wave. The gate bias adjustment unit 90 adjusts a gate bias voltage applied to the gate of the transistor 40 to an appropriate value, thereby making it possible to achieve high frequency wave amplification with specified characteristics. For example, for each PA, the adjustment section 100 varies the gate bias voltage by the gate bias adjustment unit 90, and measures a gate current Ig, a gate voltage Vg, a drain current Id, and a drain voltage Vd by the transfer characteristics measurement unit 70. Based on the measurement results, the gate bias determination unit 80 may acquire characteristics related to the distortion.

However, in a case where the gate bias voltage is changed during the PA performing the high frequency wave amplification, the amplification characteristics of the PA becomes varied. As such, instead of monitoring the PA itself and acquiring its characteristics, a transistor manufactured by the same process as the PA and having a size equal to or smaller than that of the PA, is disposed as a monitor element at a position very close to the PA (disposed on the same chip with the PA). Then, the transfer characteristics measurement unit 70 varies the gate bias voltage of the monitor element to acquire distortion characteristics of the monitor element. The distortion characteristics of the monitor element thus acquired may be regarded as the distortion characteristics of the PA near the monitor element. Since a signal output from the PA is not monitored, it is possible for the transfer characteristics measurement unit 70 to measure the characteristics of each PA in real time. FIG. 2 illustrates the plurality of monitor elements 51 to 54 that is provided for each of the plurality of PAs 41 to 44 and is disposed on the same chip with the corresponding PA.

The transfer characteristics measurement unit 70 measures transfer characteristics of each of the plurality of monitor elements 51 to 54.

Figure 3:
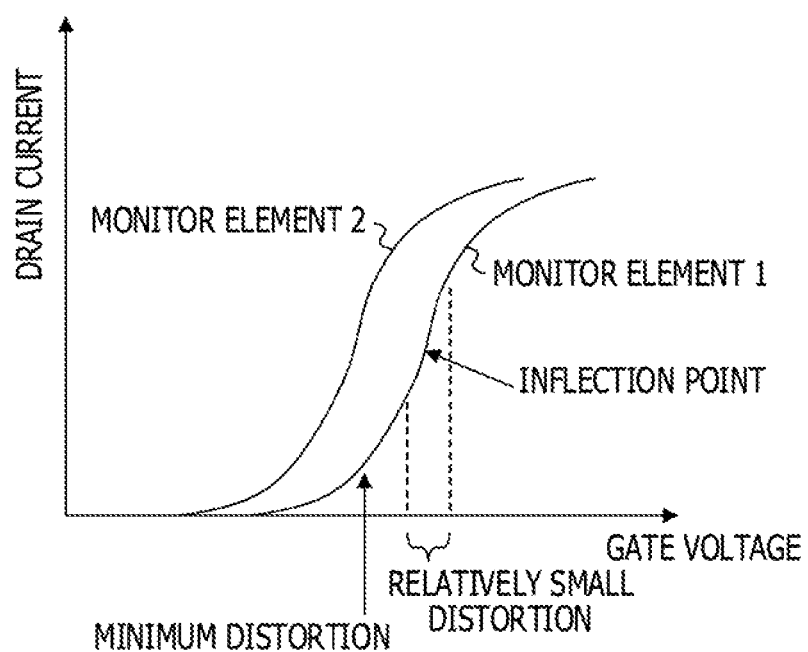
FIG. 3 is a graph illustrating an example of transfer characteristics.

FIG. 3 is a graph illustrating an example of transfer characteristics representing a relationship between a drain current and a gate voltage. In accordance with the transfer characteristics or differential characteristics obtained by differentiating the transfer characteristics with respect to the gate voltage, the characteristics of the PA causing the distortion of the output signal may be changed. When a gate voltage that causes a drain current that is separated from an inflection point is applied, the distortion becomes smaller than when a gate voltage that causes a drain current that is near the inflection point is applied. In an example of FIG. 3, it is expected that, when a gate bias voltage smaller than that applied to a $PA_1$ corresponding to a monitor element 1 is applied to a $PA_2$ corresponding to a monitor element 2, a variation in distortion characteristics between the $PA_1$ and $PA_2$ becomes smaller.

In FIG. 2, the transfer characteristics measurement unit 70 varies the gate bias voltage for each of the monitor elements 51 to 54 to acquire the distortion characteristics of each of the monitor elements 51 to 54.

For example, the transfer characteristics measurement unit 70 measures the drain current Id, the drain voltage Vd, the gate current Ig, and the gate voltage Vg for each of the monitor elements 51 to 54 while sweeping the gate bias voltage. The transfer characteristics measurement unit 70 stores the measurement results in the memory as digital values. Based on the measurement results stored in the memory, the transfer characteristics measurement unit 70 calculates characteristic values such as mutual conductance gm, a gain (a product of mutual conductance and a load resistance value), and parasitic capacitance for each of the monitor elements, for example. These characteristic values are distortion factors causing the distortion of the signal output from each of the plurality of monitor elements (for example, the signal output from each of the plurality of PAs).

The mutual conductance gm ($=\partial Id/\partial Vg$) and a second order differential value (that is, $\partial^3 Id/\partial Vg^3$) of gm are characteristic values strongly correlated with the amplitude distortion, and the parasitic capacitance is a characteristic value strongly correlated with the phase distortion. The parasitic capacitance is obtained by integrating the gate current Ig.

The gate bias dependence represented by each of the characteristic values of the mutual conductance gm, the second order differential value of gm, and the parasitic capacitance is individually acquired by the transfer characteristics measurement unit 70 with respect to the monitor element of each of the PAs through this signal processing.

The gate bias determination unit 80 determines the gate bias voltage value of the monitor element of each PA so that at least one of the characteristic values is well matched between the monitor elements of the PAs. For example, the gate bias voltage value is determined in the following procedure.

The gate bias determination unit 80 determines the gate bias voltage Vg, at which gm becomes slightly larger than 0, for each of the monitor elements of each PA.

The gate bias determination unit 80 repeats the following operation: when the second order differential value of gm of the monitor element of a certain PA is smaller at the current Vg than that of another PA, Vg is increased by one step so as to make the second order differential value of gm take the same value between the PAs.

At this time, the second order differential characteristics of gm of the monitor elements of the respective PAs are equalized. However, if the parasitic capacitance characteristics are significantly different between the monitor elements of the PAs, the gate bias determination unit 80 may set a slightly larger second order differential value of gm as a target, and may raise Vg until a variation in the parasitic capacitance characteristics becomes small enough.

Thus, Vg to be applied is determined for the monitor elements of all the PAs. The gate bias determination unit 80 transmits each of the determined gate bias voltage values Vg to the gate bias adjustment unit 90.

The gate bias adjustment unit 90 applies each of the gate bias voltage values Vg determined by the gate bias determination unit 80 to each corresponding PA. This makes it possible to equalize the distortion characteristics of the respective PAs. When the distortion characteristics of each of the PAs is equalized, it is possible for the single distortion compensation unit 16 to effectively reduce the distortion. In practice, the distortion characteristics undergo a change over time due to long operation hours. Therefore, it is preferable that the above-described operations such as characteristics measurement, characteristics comparison, bias determination, and application bias adjustment be performed periodically.

Since the distortion characteristics of the respective PAs are equalized by the adjustment operation performed by the adjustment section 100 as described above, the distortion compensation unit 16 is able to compensate for the distortion of the signal output from each of the plurality of PAs 41 to 44, based on the signal output from any one of the plurality of PAs 41 to 44. Accordingly, it is possible to adjust the overall distortion characteristics by the distortion compensation unit 16 common to the plurality of PAs.

When the number of the plurality of PAs is taken as n, the distortion compensation unit 16 may compensate for distortion of the signal output from each of the plurality of PAs, based on the signal output from each of (n-1) or less PAs among the plurality of PAs. With this, the number of couplers 20 may be reduced and the processing of the distortion compensation unit 16 may be simplified, thereby making it possible to reduce the power consumption, the circuit size, and the like. It goes without saying that, depending on the required specifications, the distortion compensation unit 16 may compensate for the distortion of the signal output from each of the plurality of PAs based on the signals output from all the PAs among the plurality of PAs.

Figure 4:
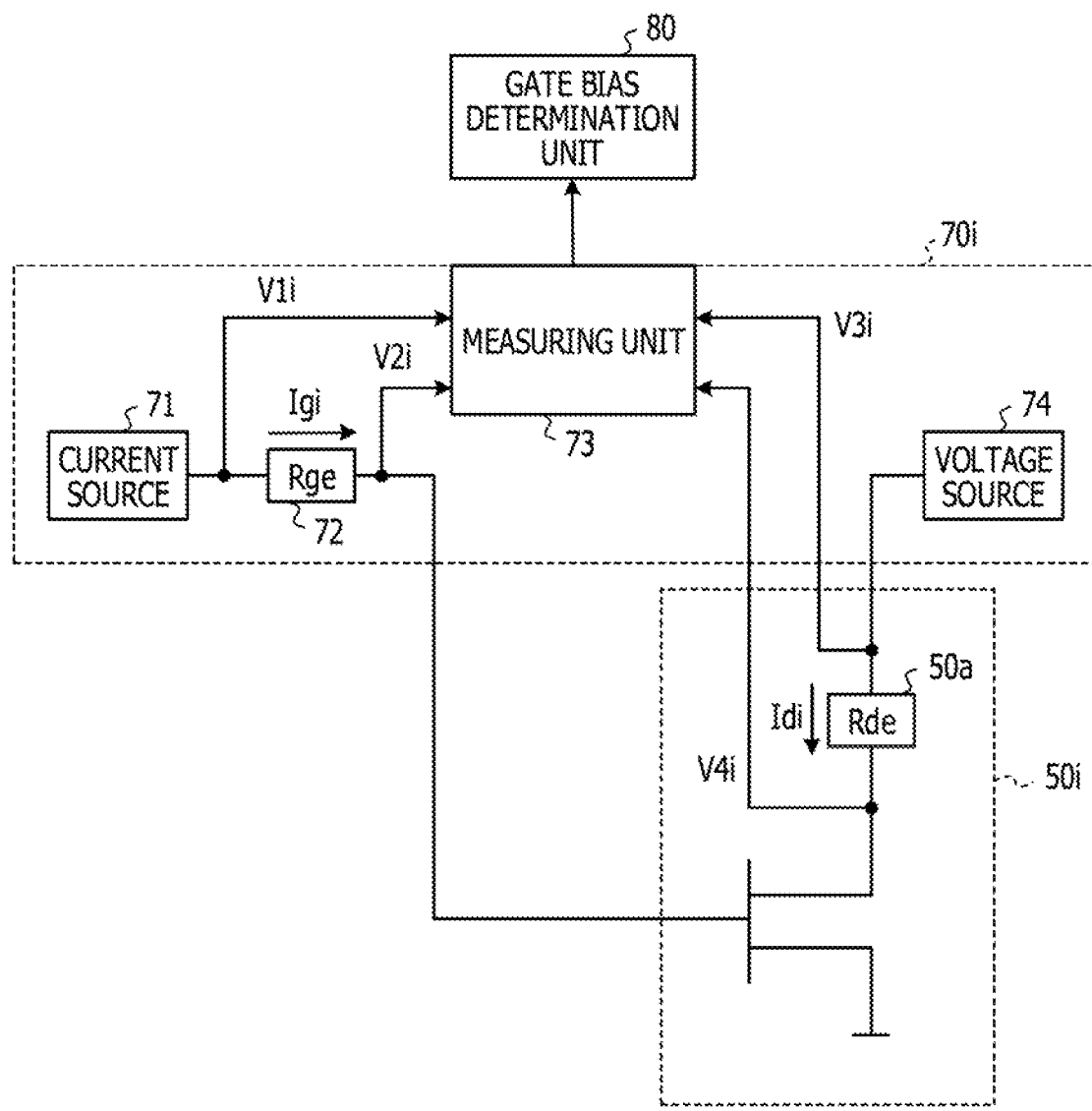
FIG. 4 is a diagram illustrating a configuration example of a transfer characteristics measurement unit.

FIG. 4 is a diagram illustrating a configuration example of the transfer characteristics measurement unit 70. A transfer characteristics measurement unit 70$_i$ is provided with, for example, a variable power source 71 including a current source and a voltage source, a resistor 72, a measuring unit 73, and a voltage source 74. The subscript "i" designates a function provided for the i-th PA or the i-th monitor element corresponding to the i-th PA, or measured data with respect to the i-th PA or the i-th monitor element corresponding to the i-th PA.

The measuring unit 73, while sweeping the output of the variable power source 71, measures a time series of voltage values V1$_i$, V2$_i$, V3$_i$, and V4$_i$ by using an ADC, and records the measured time series in a memory. A gate current Ig$_i$ is a current flowing into the gate of a monitor element 50$_i$. The measuring unit 73 determines the gate current Ig$_i$ and a drain current Id$_i$ by the following expressions.

$$Ig_i = (V1_i - V2_i)/Rge$$

$$Id_i = (V3_i - V4_i)/Rde$$

Here, Rge represents a resistance value of the gate resistor 72. Rde represents a resistance value of a load resistor 50$a$ coupled to the drain of the monitor element 50$_i$.

Figure 5:
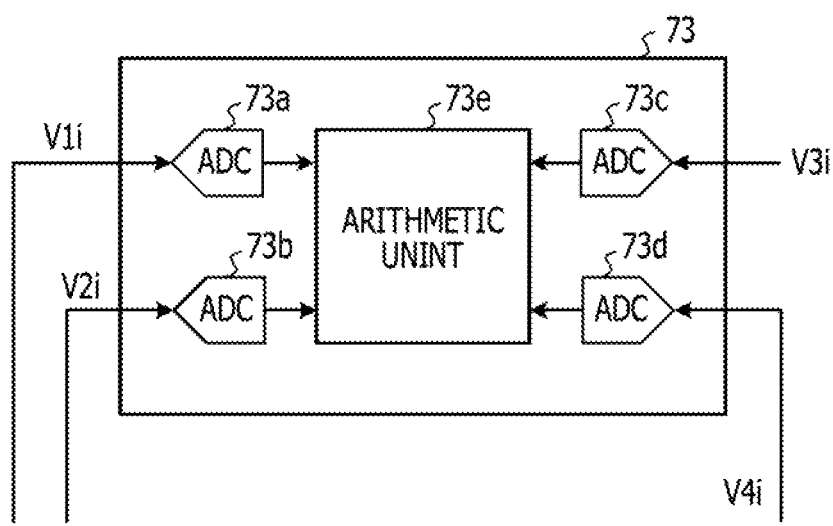
FIG. 5 is a diagram illustrating a configuration example of a measuring unit.

FIG. 5 is a diagram illustrating a configuration example of the measuring unit 73. The measuring unit 73 includes ADCs 73$a$, 73$b$, 73$c$ and 73$d$, and an arithmetic unit 73$e$. The arithmetic unit 73$e$ is able to sweep the output of the variable power source 71, and calculate the gate current Ig$_i$ and the drain current Id$_i$ based on the above expressions.

Figure 6:
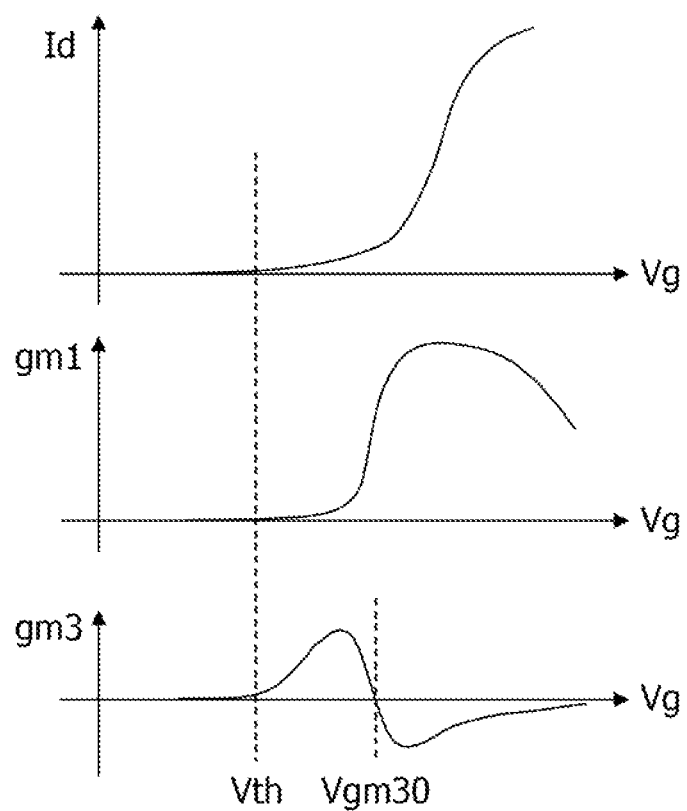
FIG. 6 is a graph illustrating an example of relationships between Vg and Id, Vg and gm1, and Vg and gm3.

FIG. 6 is a graph illustrating an example of relationships between Vg and Id, Vg and gm1, and Vg and gm3. The relationship between the drain current Id$_i$ and a gate voltage Vg$_i$ ($=V2_i$) (transfer characteristics) becomes an important distortion factor causing the distortion of the output signal of the transistor. The arithmetic unit 73$e$ of the measuring unit 73 calculates gm1$_i$, gm2$_i$, and gm3$_i$ by the following expressions.

$$gm1_i = \partial Id_i/\partial Vg_i$$

$$gm2_i = \partial^2 Id_i/\partial Vg_i^2$$

$$gm3_i = \partial^3 Id_i/\partial Vg_i^3$$

Here, gm1$_i$ represents the mutual conductance gm, and gm3$_i$ represents the second order differential value of gm.

Further, gm3 is an amount correlated with a third order intermodulation distortion IM3. The gate bias determination unit 80 may determine the gate bias voltage values of the monitor elements of the respective PAs so that gm3 is well matched between the monitor elements of the PAs. A phase component of the IM3 largely changes near a gate voltage Vgm30$_i$ where gm3$_i$ becomes 0. For example, the gate bias voltage values for matching gm3 between the monitor elements (for example, matching the IM3 between the PAs) are determined as follows.

As for the i-th PA, the gate bias determination unit 80 measures a threshold value Vth$_i$ of the transistor from Id$_i$ or gm1$_i$, and measures the gate voltage Vgm30$_i$ where gm3$_i$ becomes 0.

The gate bias determination unit 80 sets a constant value ΔVgmp (≥0) that is common between the PAs, in such a manner as to satisfy the following expression.

$$Vg_i=(Vgm30_i-\Delta Vgmp)>Vth_i$$

The gate bias adjustment unit 90 applies Vg$_i$ determined in accordance with the above expression to the gate of the i-th PA.

By applying the gate bias voltage value thus determined, it is possible to improve the power efficiency of the PA, and suppress a variation in phase of the IM3 between the PAs.

The gate bias adjustment unit 90 may use a constant value ΔVgmd (≥0) that is common between the PAs, and may apply Vg$_i$ determined by the following expression to the gate of the i-th PA.

$$Vg_i=Vgm30_i+\Delta Vgmd$$

By applying the gate bias voltage value thus determined, although the power efficiency of the PA is lowered, it is possible to raise the gain of the PA and suppress the variation in phase of the IM3 between the PAs.

The former method for determining the gate bias voltage value is suitable for power amplification applications, and the latter method for determining the gate bias voltage value is suitable for driver applications.

Here, when there is a variation in Id with respect to Vg$_i$ determined as described above between the PAs, the adjustment section 100 may adjust the drain bias voltage to be applied to each PA. When Id$_i$ of the i-th PA is smaller than Id$_i$ of the other PAs, the adjustment section 100 raises the drain bias Vd$_i$; when Id$_i$ thereof is larger than Id$_i$ of the other PAs, the drain bias Vd$_i$ is lowered. This reduces a variation in gain between the PAs (variation in Id$_i$ with respect to Vg$_i$).

In order to suppress a variation in characteristics of each of the PAs, the gate bias adjustment unit 90 may adjust the gate bias voltage Vg of each PA so that an idle current Idq (drain current of PA in a state where a high frequency signal is not input) takes a specified value that is common between the PAs. In addition, in order to suppress a time variation in characteristics of each of the PAs, the gate bias adjustment unit 90 may appropriately update the gate bias voltage Vg of each PA so that the idle current Idq falls within a set range. With such adjustment and updating, it is possible to suppress the variation in gain between the PAs, and achieve an effect of reducing the distortion to some extent.

Figure 7:
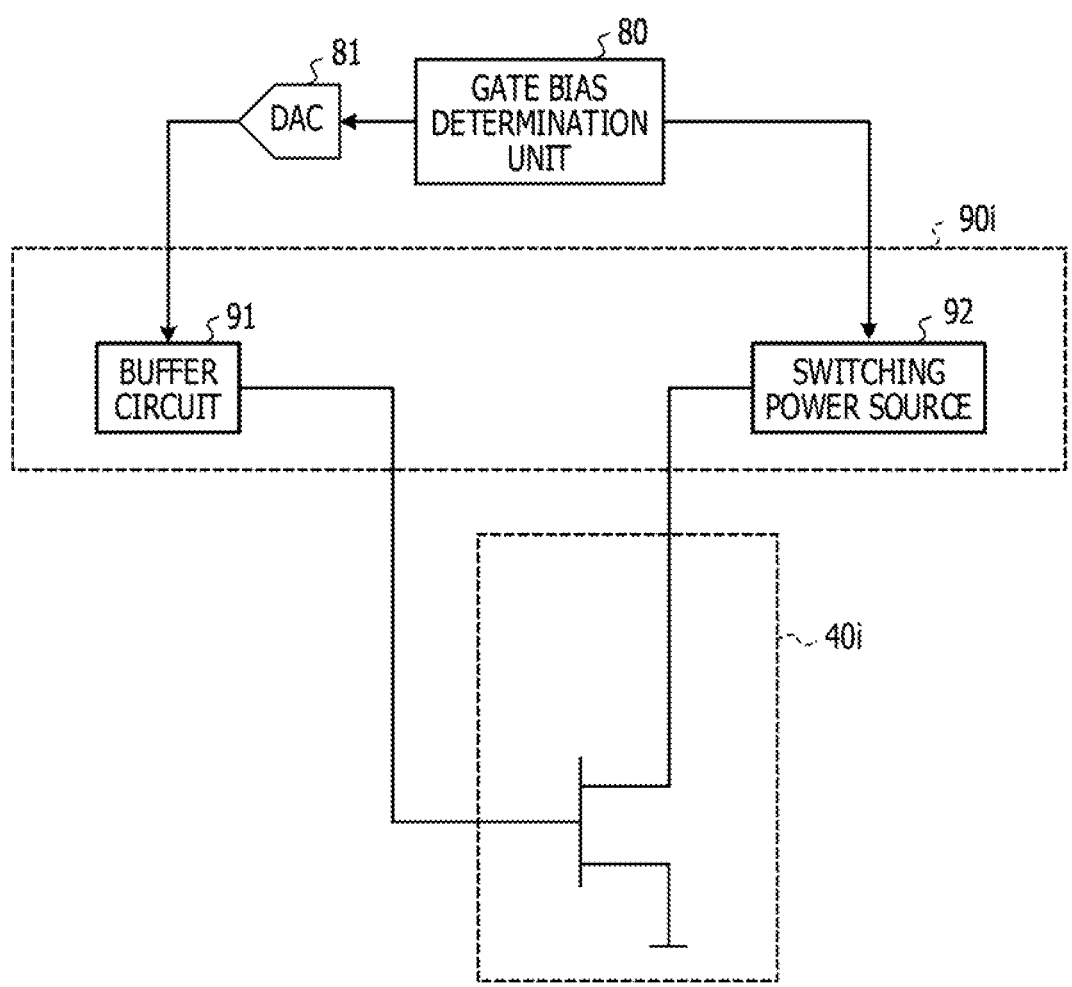
FIG. 7 is a diagram illustrating a configuration example of a gate bias adjustment unit.

FIG. 7 is a diagram illustrating a configuration example of a gate bias adjustment unit 90$_i$. The gate bias adjustment unit 90$_i$ includes a buffer circuit 91 and a switching power source 92. A transistor 40$_i$ is a transistor in the i-th PA among the plurality of PAs 41 to 44. The buffer circuit 91 applies a gate bias voltage, which is determined by the gate bias determination unit 80 and is supplied via a DAC 81, to the gate of the transistor 40$_i$. The switching power source 92 applies a drain bias voltage determined by the gate bias determination unit 80 to the drain of the transistor 40$_i$.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. An amplifier circuit comprising:
a plurality of amplifiers;
a plurality of monitor elements provided for each of the plurality of amplifiers and disposed on a same chip with the corresponding amplifier; and
a processor configured to:
measure a plurality of characteristics of each of the plurality of monitor elements; and
determine an application voltage applied to each of the plurality of amplifiers in such a manner that at least one of values of the plurality of characteristics matches with each other among the plurality of monitor elements to compensate for a distortion between a plurality of signals output from the plurality of amplifiers.

2. The amplifier circuit according to claim 1, wherein the processor is configured to:
determine an adjustment signal to reduce a difference in the characteristics between each of the plurality of monitor elements; and
reduce the difference in distortion based on the adjustment signal.

3. The amplifier circuit according to claim 1, wherein the application voltage is a gate bias voltage applied to a gate of each of the plurality of amplifiers.

4. The amplifier circuit according to claim 1, wherein the application voltage is a drain bias voltage applied to a drain of each of the plurality of amplifiers.

5. The amplifier circuit according to claim 1, wherein the characteristics are transfer characteristics representing a relationship between a drain current and a gate voltage of each of the plurality of monitor elements.

6. The amplifier circuit according to claim 5, wherein the characteristics are differential characteristics obtained by differentiating the transfer characteristics with respect to the gate voltage.

7. The amplifier circuit according to claim 5, wherein the characteristics are third order differential characteristics obtained by performing third order differential on the transfer characteristics with respect to the gate voltage.

8. The amplifier circuit according to claim 1, wherein when a number of the plurality of amplifiers is taken as n, the processor is configured to compensate for distortion of the signal output from each of the plurality of amplifiers, based on the signal output from each of (n-1) or less amplifiers among the plurality of amplifiers.

9. The amplifier circuit according to claim 1, wherein the characteristics are a distortion factor causing the distortion of a signal output from each of the plurality of monitor elements.

10. An antenna device comprising:
a plurality of antennas;

a plurality of amplifiers provided for each of the plurality of antennas to output a signal to the corresponding antenna;

a plurality of monitor elements provided for each of the plurality of amplifiers and disposed on a same chip with the corresponding amplifier; and a processor configured to:

measure a plurality of characteristics of each of the plurality of monitor elements; and determine an application voltage applied to each of the plurality of amplifiers in such a manner that at least one of values of the plurality of characteristics matches with each other among the plurality of monitor elements to compensate for a distortion between a plurality of signals output from the plurality of amplifiers.

11. The antenna device according to claim 10, wherein the processor is configured to: determine an adjustment signal to reduce a difference in the characteristics between each of the plurality of monitor elements; and reduce the difference in distortion based on the adjustment signal.

12. The antenna device according to claim 10, wherein the application voltage is a gate bias voltage applied to a gate of each of the plurality of amplifiers.

13. The antenna device according to claim 10, wherein the application voltage is a drain bias voltage applied to a drain of each of the plurality of amplifiers.

14. The antenna device according to claim 10, wherein the characteristics are transfer characteristics representing a relationship between a drain current and a gate voltage of each of the plurality of monitor elements.

15. The antenna device according to claim 14, wherein the characteristics are differential characteristics obtained by differentiating the transfer characteristics with respect to the gate voltage.

16. The antenna device according to claim 14, wherein the characteristics are third order differential characteristics obtained by performing third order differential on the transfer characteristics with respect to the gate voltage.

17. The antenna device according to claim 10, wherein when a number of the plurality of amplifiers is taken as n, the processor is configured to compensate for distortion of the signal output from each of the plurality of amplifiers, based on the signal output from each of (n-1) or less amplifiers among the plurality of amplifiers.

18. The antenna device according to claim 10, wherein the characteristics are a distortion factor causing the distortion of a signal output from each of the plurality of monitor elements.

* * * * *